United States Patent
Keyse et al.

[11] Patent Number: 5,856,941
[45] Date of Patent: Jan. 5, 1999

[54] ONE-TIME PROGRAMMABLE LATCH WHICH ALLOWS VOLATILE WRITES PRIOR TO PERMANENT PROGRAMMING

[75] Inventors: Mark Russell Keyse, Sharpsville; Gregory Jon Manlove, Kokomo; Pedro E. Castillo-Borelly, Kokomo; Seyed Ramezan Zarabadi, Kokomo, all of Ind.

[73] Assignee: Delco Electronics Corporation, Kokomo, Ind.

[21] Appl. No.: 929,457

[22] Filed: Sep. 15, 1997

[51] Int. Cl.[6] ................................................. G11C 11/00
[52] U.S. Cl. .................... 365/154; 365/156; 365/185.07; 365/185.08
[58] Field of Search .................................. 365/154, 156, 365/185.05, 185.07, 185.08

[56] References Cited

U.S. PATENT DOCUMENTS

| | | | |
|---|---|---|---|
| 4,128,773 | 12/1978 | Troutman et al. | 365/185.07 |
| 4,132,904 | 1/1979 | Harari | 365/185.07 |
| 4,348,745 | 9/1982 | Schmitz | 365/154 |
| 5,523,971 | 6/1996 | Rao | 365/154 X |
| 5,606,523 | 2/1997 | Mirabel | 365/154 X |
| 5,648,885 | 7/1997 | Matsuo et al. | 365/185.05 |
| 5,648,930 | 7/1997 | Randazzo | 365/185.07 |

*Primary Examiner*—Huan Hoang
*Attorney, Agent, or Firm*—Jimmy L. Funke

[57] ABSTRACT

A cross-coupled latch circuit that is a one-time programmable latch that allows volatile temporary writes to the latch prior to permanent programming of the latch. The latch circuit includes first and second programmable FET devices that include poly-poly capacitors in series with the gate terminal of each device. A pair of PMOS FET devices combine with the programmable devices to make up the latch. The latch circuit includes other FET devices that are switched on and off depending on whether the latch is being permanently programmed, temporarily written to, or reset. A NAND gate is provided such that a logical high output on the NAND gate allows the first programmable device to be temporarily programmed with a logical one and permanently programmed with a logical zero. A NOR gate is provided such that a logical high on the NOR gate allows the second programmable device to be temporarily programmed with a logical zero and permanently programmed with a logical one.

30 Claims, 5 Drawing Sheets

ONE-TIME PROGRAMMABLE LATCH WHICH ALLOWS VOLATILE WRITES PRIOR TO PERMANENT PROGRAMMING

BACKGROUND OF THE INVENTION

1. Field of the Invention

This invention relates generally to a digital programmable latch for storing a logical "0" or a logical "1" and, more particularly, to a digital programmable latch for storing a logical "0" or a logical "1" that allows volatile temporary writes to be stored in the latch prior to the latch being permanently programmed.

2. Discussion of the Related Art

Many module systems require customization of system components at the time that the components are assembled as part of a module assembly or module installation. For example, for many module sensor systems, the normal parametric spreads of sensor elements in the system prevents a one-size-fits-all solution to the signal conditioning of the sensor output. Minor differences in sensor element gain, offset, resonant modes, temperature characteristics, etc. make it necessary to trim or customize the signal conditioning to a specific sensor element at the time of assembly. Examples of things that need to be independently calibrated include reference voltage level inputs to a comparator, identification codes, etc. Once this customization has been performed, it will remain as part of the sensor element throughout the life of the product.

Generally, arriving at the proper customization for a particular sensor element is an iterative process. Therefore, a need exists for a technique to iteratively determine the proper compensation for a given sensor element, and then, to permanently program the signal conditioning device with these values.

Known methods of compensating the output of sensor elements have included use of laser trimming of resistors on a module substrate or the use of a "zener zapping" technique. With the zener zapping technique, an array of zener diodes is used to trim in a value by selectively shorting out (zapping) the junctions of diodes that are in parallel with certain resistors. This process effectively removes the resistor from the circuit. However, a number of drawbacks exist with this technique. For example, large resistor values are required due to the relatively high resistance of the shorted junction, the large size of the circuitry required to address and short out a particular diode, and the relatively high current levels required to short out the diode junctions.

What is needed is a technique for determining proper compensation for a customized component prior to permanent programming, that does not suffer the drawbacks of the prior art techniques. In other words, what is needed is a bit storage circuit that allows multiple temporary programming before being permanently programmed. It is therefore an object of the present invention to provide such a technique.

SUMMARY OF THE INVENTION

In accordance with the teaching of the present invention, a cross-coupled latch circuit is disclosed that includes a one-time programmable MOS transistor latch that allows volatile temporary writes to this device prior to its permanent programming. The latch circuit includes first and second programmable FET devices that include poly-poly capacitors in series with the gate terminal of the device. One of either the source terminal or the drain terminal of the first and second programmable FET devices are connected to a reference potential. The first and second programmable devices and first and second FET devices make up a cross-coupled latch where the source or drain terminal of the first FET device is connected to the source or drain terminal of the first programmable device that is not connected to the reference potential, and the source or drain terminal of the second FET device is connected to the source or drain terminal of the second programmable device that is not connected to the reference potential.

The latch circuit includes other FET devices that are switched on and off depending on whether the latch is being permanently programmed, temporarily written to, or reset. A first logic gate is provided where a logical high output signal on the first logic gate allows the first programmable device to be temporarily programmed with a logical one and permanently programmed with a logic zero. A second logic gate is provided where a logical high output on the second logic gate allows the second programmable device to be temporarily programmed with a logical zero and permanently programmed with a logical one.

Additional objects, advantages, and features of the present invention will become apparent from the following description and appended claims, taken in conjunction with the accompanying drawings.

DETAILED DESCRIPTION OF THE PREFERRED EMBODIMENTS

Figure 1:
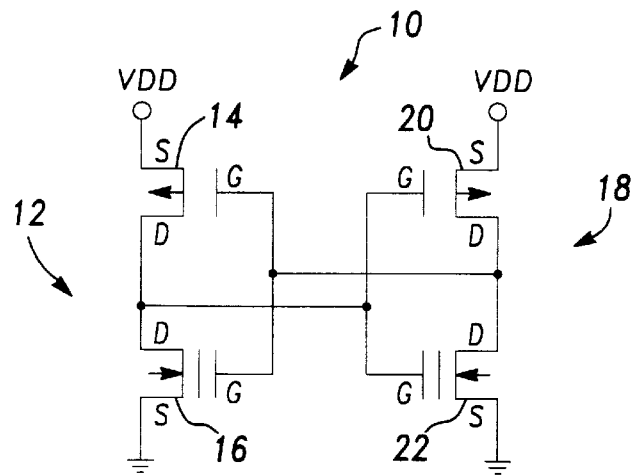
FIG. 1 is a schematic diagram of a CMOS cross-coupled latch that performs the function of the invention.

The following discussion of the preferred embodiments directed to a cross-coupled latch that allows volatile writes to the latch prior to permanent programming of the latch is merely exemplary in nature and is in no way intended to limit the invention or its applications or uses.

This invention is directed to a cross-coupled latch circuit that incorporates one-time programmable MOS transistors and allows volatile temporary writes to the latch prior to permanent programming of the latch. The programming technique of the invention relies on semiconductor memory elements to permanently store calibration settings. Known memory elements that store calibration settings generally incorporate arrays of metal oxide semiconductor (MOS) transistor devices defining EPROM (electrically programmable read only memory) or EEPROM (electrically erasable programmable read only memory) devices having a plurality of programmable latches. A discussion of EPROM and EEPROM devices of the type used in this can be found in U.S. patent application Ser. No. 08/963,489, filed Nov. 3, 1997, titled EPROM In Double Poly High Density CMOS, assigned to the assignee of the instant application and herein incorporated by reference. If EPROM devices were used, an additional latch would be required to allow temporary values to be written during the calibration process. EEPROM devices do not require the additional latch, but have the drawback of requiring much higher process complexity.

The present invention uses an approach which is a hybrid of both the known EPROM and EEPROM techniques. A circuit of the invention is proposed which utilizes a one-time programmable metal oxide semiconductor (MOS) transistor (PMT) latch device in a configuration that allows the latch device to be temporarily written to multiple times prior to being permanently programmed. A latch configuration was selected as the proposed design over a memory array for several reasons. First, the number of memory elements required for such a technique would be much less than that associated with a memory array. Secondly, the latch circuit contains two memory elements which provides redundancy and thus improved reliability. Further, the proposed circuit will be less sensitive to degradation of the memory elements over time, temperature, etc. This concept cannot only be applied to the compensation of sensor elements as mentioned above, but can be extended to allow for customization of other parameters, such as enabling/disabling functions, storing module identification data, voltage/time thresholds, etc. Also, the circuit may be used to trim high performance data converters, integrated filters and signal processing elements. The technique allows for customization of a semiconductor device for different applications without the burden of multiple mask sets and without the process complexity associated with having an EEPROM device. The proposed circuitry is accessible at test and assembly time of the device via a serial peripheral interface (SPI).

In order to understand the design of the invention, it will first be beneficial to review FIG. 1 showing a known simple cross-coupled latch circuit 10. The latch circuit 10 consists of two inverter circuits 12 and 18 with the output of the inverter 12 connected to the input of the inverter 18 and vice-versa. The inverter circuit 12 consists of a P-type Metal-Oxide-Semiconductor (MOS) Field Effect Transistor (FET) 14 and a Programmable MOS Transistor (PMT) 16 connected as shown. The second inverter circuit 18 of the latch circuit 10 includes a PMOS 20 and PMT 22. The combination of these two inverter circuits 12 and 18 forms the latch 10. The FET devices of the latch circuit 10 each have their source (S), drain (D), and gate (G) terminals labeled accordingly. The designation of the different terminals is based on whether the FET device is a PMOS or an NMOS type device, as indicated by the direction of the substrate arrow. This orientation of terminals for the various PMOS and NMOS FET devices is carried out through the discussion below.

After programming, the programmed PMT device 22 will be weak, and the unprogrammed PMT device 16 will be strong. Due to the positive feedback inherent in the way that a cross-coupled latch is connected, the latch circuit 10 will always power-up in the same state, dictated by the programming of the two devices 16 and 22. This will be true even if the difference in the device strength, as judged by the threshold voltage, is only moderate, on the order of several hundred millivolts. In addition, the latch circuit 10 can be easily forced into one of its two stable states (particularly when neither device 16 or 22 is programmed), by externally forcing the gate connections of the inverters 12 and 18 to opposite states.

Figure 2:
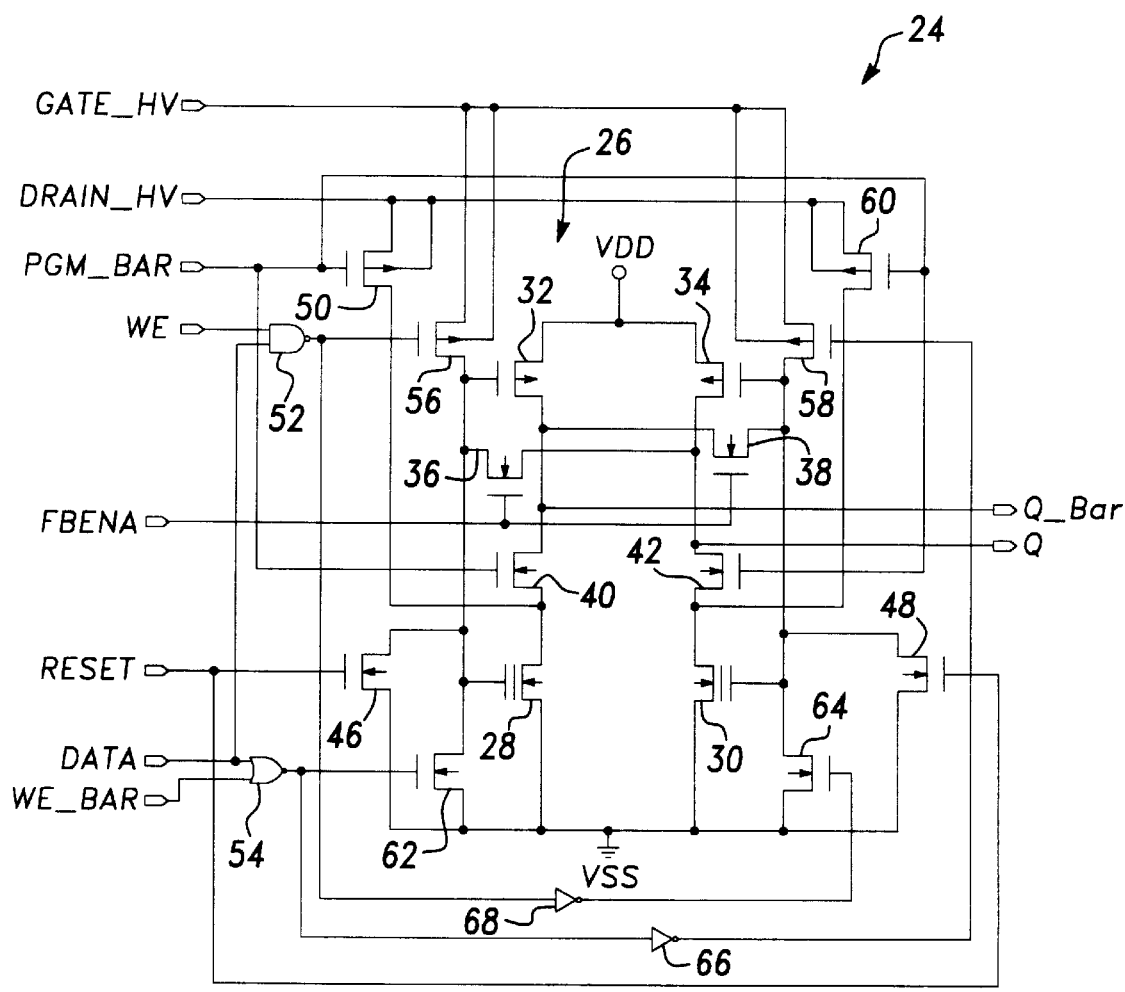
FIG. 2 is a schematic diagram of a PMT latch circuit incorporating a cross-coupled latch, according to an embodiment of the present invention.

FIG. 2 shows a PMT latch circuit 24, according to an embodiment of the present invention, including a cross-coupled latch 26 similar to the latch circuit 10, above. The latch 26 includes a first n-channel PMT device 28 and a second n-channel PMT device 30. The PMT devices 28 and 30 are composite devices which include a poly-poly capacitor in series with the gate terminal of a standard NMOS device. The result is a device which can be programmed, i.e., its threshold voltage can be changed. The cross-coupled latch 26 also includes PMOS FET devices 32 and 34 that combine with the devices 28 and 30 to make a latch of the type shown in FIG. 1. NMOS FET devices 36, 38, 40 and 42 are electrically connected as shown, and make up additional circuit components of the latch 26. Q and Q_BAR outputs are connected to the latch 26 as shown, such that when one of the Q or Q_BAR outputs is low, the other is high.

The PMT devices 28 and 30 can be programmed by placing high voltages (typically 10–14 volts) on the drain terminal of both of the devices 28 and 30, and on the gate terminal of the device to be programmed. This results in a threshold shift of the device which under normal conditions will result in a threshold that is higher than the threshold of an unprogrammed device. When the latch 26 has been successfully programmed, only one of the two programmable devices 28 and 30 will be programmed. When the PMT devices 28 and 30 are programmed, a voltage potential is trapped on one of the plates of the capacitors associated with the device 28 or 30. If the latch circuit 24 is programmed with a logical 1, the PMT device 30 holds the charge, and the device 28 is uncharged. If the latch circuit 24 is programmed with a logical 0, the PMT device 28 holds the charge, and the device 30 is uncharged. If either of the PMT devices 28 or 30 is programmed, the latch 26 will always be set in the same direction due to the threshold difference between the devices 28 and 30. Although a threshold shift as small as a few hundred millivolts will cause the latch 26 to be set properly, it is desirable to have the threshold difference as large as possible so the latch will not flip if the threshold should shift over time, or due to the presence of noise.

The latch circuit 24 further includes various other FETs and logic gates electrically interconnected as shown to provide temporary and permanent programming of the devices 28 and 30, as will be discussed below. A RESET input is applied to the gate terminal of NMOS FET devices 46 and 48 to insure that the cross-coupled latch 26 is properly set. It is normally asserted (high), and then deasserted (low) at power-up of the circuit 24, or immediately following the programming of the latch 26. When the RESET input is asserted, the gate terminals of the devices 28, 30, 32 and 34 are grounded through the device 46 and NMOS FET device 48. When the RESET input is deasserted, the devices 32 and 34 will initially both be on, which pulls the Q and Q_BAR outputs, respectively, to VDD (5 volts).

During normal operation, the FBENA input applied to the gate terminals of the devices 36 and 38 is high, providing feedback between the Q_BAR output and the gate terminal of the device 30, and between the Q output and the gate terminal of the device 28. As the voltage on the Q_BAR and Q outputs rises, the non-programmed device 28 or 30 will turn on, causing the cross-coupled latch 26 to be set. If the device 28 is programmed, the latch 26 will be set such that the Q_BAR output is high. If the device 30 is programmed, the latch 26 will be set such that the Q output is high.

Also, during normal operation, a PGM_BAR input (which is high) is applied to the gate terminal of a PMOS FET 50 and a PMOS FET 60 so that the devices 40 and 42 will be on, and will have no effect on the operation of the cross-coupled latch 26. Also, a WE input (which is low) is applied to one terminal of a NAND gate 52, and a WE_BAR input (which is high) is applied to one terminal of a NOR gate 54 so that a PMOS FET device 56, a PMOS FET device 58, the device 50, the device 60, an NMOS FET device 62 and an NMOS FET device 64 will all be turned off, and will have no effect on the cross-coupled latch 26. Under normal operating conditions, both a GATE_HV input and a DRAIN_HV input will be held at approximately VDD.

Prior to permanent programming of one of the two PMT devices 28 or 30, it is possible to write data temporarily to the latch 26 without permanently programming it. This is accomplished through the use of the WE, $WE_{13}$ BAR, the DATA input applied to the other terminal of the NOR gate 54 and the other terminal of the NAND gate 52, and the FBENA input signals. The logic level of the DATA input signal will correspond to the desired level of the Q output. The WE input will be held high, and the $WE_{13}$ BAR and FBENA input signals will be held low. Holding the FBENA input signal low turns the devices 36 and 38 off, which shuts off the feedback in the cross-coupled latch 26. If the DATA input signal is low, the NOR gate 54 will cause the device 62 to be on, thus pulling the gate terminals of the device 32 and the device 28 low, causing the Q_BAR output to go high. Additionally, an inverter 66 will cause the device 58 to be on, pulling the gate terminals of the device 34 and the device 30 to go high, causing the Q output to go low. Likewise, if the DATA input signal is high, the NAND gate 52 will cause the device 56 to be on, thus pulling the gate terminals of the device 32 and the device 28 high. Additionally, an inverter 68 will cause the device 64 to be on, pulling the gate terminals of the device 34 and the device 30 low, causing the Q output to go high.

The WE and $WE_{13}$ BAR input signals are simultaneously deasserted as the FBENA input signal is being reasserted, and the cross-coupled latch 26 holds the value programmed. This process can be repeated as often as desired prior to permanent programming of the latch 26. Under normal operation, the GATE_HV and DRAIN_HV inputs are held at VDD, usually 5 volts.

The procedure for permanently programming the latch 26 is similar to the procedure for temporarily programming it. The main difference is the level of the DATA input signal. The DATA input signal must be opposite to the desired value of the Q output under normal conditions. In addition, the PGM_BAR input signal must be asserted and the GATE_HV and DRAIN_HV inputs must be at the programming voltage levels. Asserting the PGM_BAR input signal turns on the devices 50 and 60, and turns off the devices 40 and 42, pulling the drain terminals of the devices 28 and 30 to the level of the DRAIN_HV input signal through the devices 50 and 60, respectively. As in the case of temporarily writing to the latch 26, the WE input signal is held high, and the $WE_{13}$ BAR and the FBENA input signals are held low. If the DATA input signal is low, the NOR gate 54 will cause the device 62 to be on, pulling the gate terminal of the device 28 low, and the inverter 66 will cause the device 58 to be on, pulling the gate terminal of the device 30 to the level of the GATE_HV input signal. Conversely, if the DATA input signal is high, the NAND gate 52 will cause the device 56 to be on, pulling the gate terminals of the devices 32 and 28 to the level of the GATE_HV input signal, and the inverter 68 will cause the device 64 to be on, pulling the gate terminals of the devices 30 and 34 low. After sufficient time has elapsed to ensure that either the device 28 or 30 has been programmed, the WE, WE_BAR, and PGM_BAR input signals are deasserted simultaneously as the FBENA input signal is reasserted. After programming, it may be necessary to momentarily assert the RESET input signal to ensure that the latch 26 is set properly.

The PMT latch circuit 24 performs the desired task of allowing temporary and permanent writes while at the same time being highly reliable over time. In addition, it does so without adding additional complexity to the IC fabrication process.

There are two stable configurations of the latch 26. These stable configurations are when Q equals zero volts and Q_BAR equals 5 volts, or when Q equals 5 volts and Q_BAR equals zero volts. When the latch 26 is placed in either of these two stable states, the latch 26 will remain there until forced into a new state or until powered down. To place the latch 24 in one of the two stable states for a temporary write condition, a high (5 volts) is applied to the WE input and a high is applied to the DATA input such that the NAND gate 52 outputs a low signal. The $WE_{13}$ BAR input is kept low. In this configuration, the devices 56 and 64 are switched on, and the devices 36 and 38 are switched off to charge the devices 28 and 30 such that the Q output is high and the Q_BAR output is low. This is a temporary write of a logic one. In the other stable state for a temporary write condition, the WE input remains high, the $WE_{13}$ BAR input remains low, and the DATA input is switched low, such that the NOR gate 54 outputs a high signal. In this configuration, the devices 62 and 58 are switched off and the devices 64 and 56 are switched on to charge the devices 28 and 30 such that there is a low output at Q and a high output at Q_BAR. This is a temporary write of a logic zero.

Once the latch circuit 26 has been temporarily written to, the appropriate voltage signals from the inputs are applied to the circuit 24, as discussed above, so that each of the devices 46, 48, 50, 56, 58, 60, 62, and 64 does not have an influence on the circuit 24. Additionally, appropriate voltage signals are applied to the gate terminals of the devices 36, 38, 40, and 42 so that they are switched on, and act as resistances in the circuit 24. Thus, the PMT latch circuit 24 in essence is a cross-coupled latch of the type shown in FIG. 1. This type of configuration is equivalent to that of many static RAMs, and is unique here in that the same circuitry is used for permanently programming as is used for temporary writes.

For permanent programming, the data supplied to program the latch 26 is opposite to that required to temporarily write to the latch 26. For permanently programming a logical zero, a high is applied to the WE and DATA input signals, and the $WE_{13}$ BAR input is kept low. Just as above, the devices 56 and 64 are turned on, and the devices 36 and 38 are switched low. Further, a low signal on a PGM_BAR input turns off the devices 40 and 42. The PGM_BAR input also turns on devices 50 and 60. In this condition, Q is high and Q_BAR is low. For permanently programming a logical one, the WE input is high, and the $WE_{13}$ BAR and data inputs are low. As above, the devices 58 and 62 are turned on. In this configuration, the Q output is low and the Q_BAR output is high. After the latch 26 is permanently programmed, each of the devices 46, 48, 50, 56, 58, 60, 62, and 64 are switched low, and the devices 36, 38, 40, and 42 are maintained high. For a logic zero, the device 28 has been programmed (i.e. the threshold voltage of the device has been increased), and for a logic one, the device 30 has been programmed.

After programming, whenever the latch circuit 24 is powered up, the latch 26 is put into a reset condition where a high on the reset input switches the device 46 and 48 on. When the reset signal is removed, the latch 26 will go into a stable state depending on which of the two PMT devices 28 and 30 is programmed.

Figure 3:
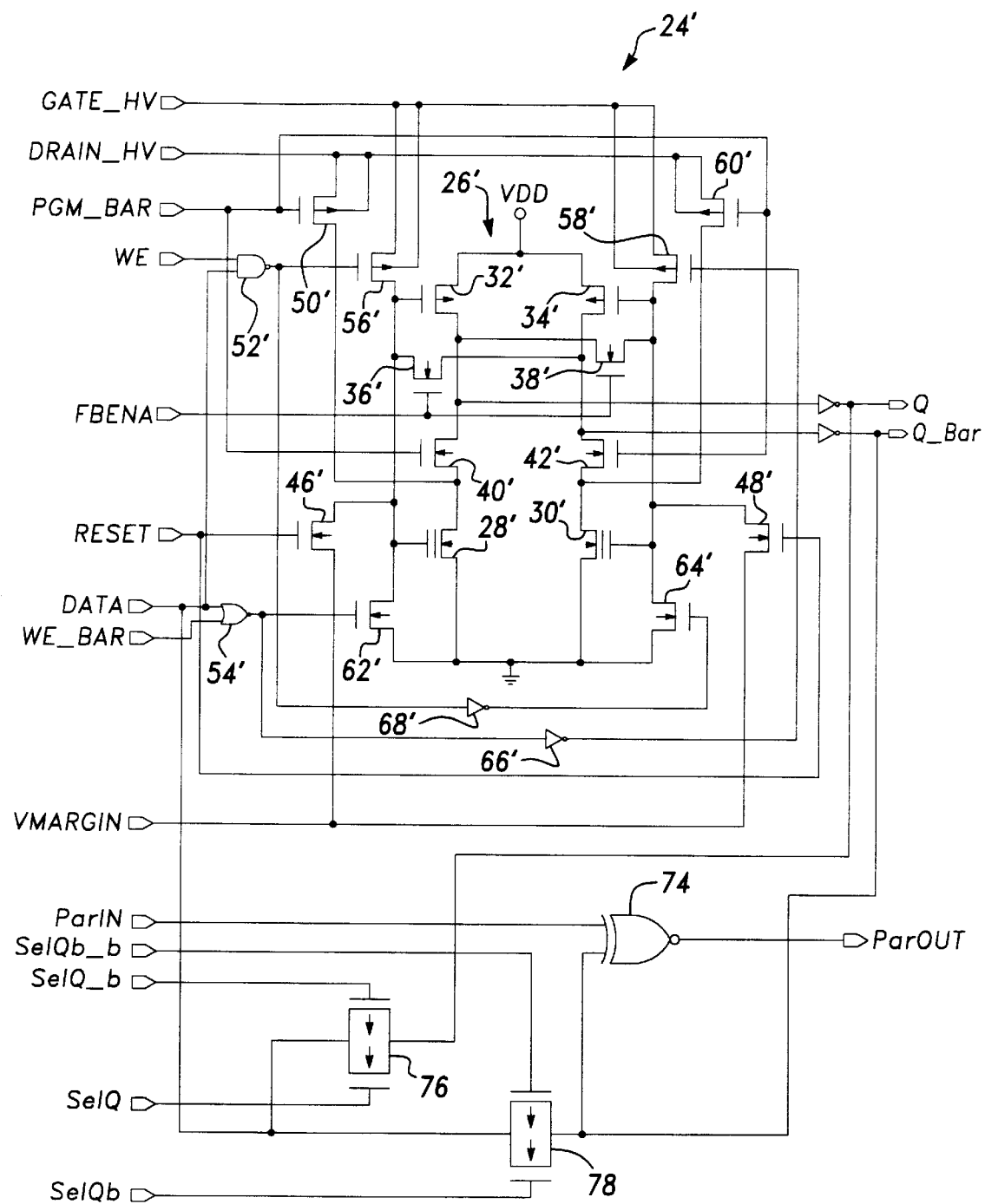
FIG. 3 is a schematic diagram of a PMT latch circuit incorporating a cross-coupled latch according to another embodiment of the present invention.

FIG. 3 is a PMT latch circuit 24' that is similar to the latch circuit 24 shown in FIG. 2, but which includes enhancements to the testability of the design. For the latch circuit 24', like components to those components of the latch circuit 24 include the same reference numeral followed by a prime. The new design allows the depth of programming of the devices 28' and 30' to be determined after programming. For the latch circuit 24, the source terminals of the devices 46 and 48 were connected to a VSS reference potential. For the latch circuit 24', the devices 46' and 48' are now tied to a new input referred to as VMARGIN. During normal operation, the VMARGIN input signal is externally tied to the VSS reference potential. Under special test conditions, the VMARGIN input signal is externally tied to a voltage which can be varied to determine the threshold of the devices 28' and 30'. When in this special test mode, the RESET signal is forced high, and the FBENA signal is forced low. This causes the two sides of the cross-coupled latch 26' to be decoupled. If the threshold of the device 28' is lower than the voltage of the VMARGIN input signal, the Q output of the latch circuit 24' will be high. Conversely, if the threshold of the device 28' is higher than the voltage of the VMARGIN input signal, the Q output of the latch circuit 24' will be low. The same holds true for the device 30' and the Q_BAR output. If the threshold of the device 30' is lower than the voltage of the VMARGIN input signal, the Q_BAR output will be high, and if it is higher than the voltage of the VMARGIN input signal, the Q_BAR output will be low. This insures that neither device 28' or 30' is programmed prior to programming, and to determine the relative depth of programming, by determining the threshold voltage, of the device 26' or 28' after programming.

The latch circuit 24' includes a built-in parity check that detects the state of the programmed latch 26'. The parity check portion of the circuit 24' consists of an exclusive NOR gate 74. One input to the gate 74 comes from the Q_BAR output of the PMT latch circuit 24'. The other input comes from the ParIN input, which is connected to the ParOUT output of the previous PMT latch circuit 24'. The parity check circuits of all PMT latches on a chip are cascaded to form a parity chain. The ParIN input of the first latch on the chain is tied low. The ParOUT output of the last latch on the chain is used to determine the parity of the entire chain. When the PMT latches are permanently programmed, the parity of the entire chain is set to a known value. The parity of the chain can then be monitored to determine if the output of a single PMT latch changes. There are several ways that the value stored in a PMT latch can change. Over time, the charge stored on the gate of a PMT transistor can leak off, causing the threshold to decay towards its unprogrammed value. EMI events could also upset a PMT latch, causing it to flip to the other stable state. Through the use of the parity chain, these conditions can be detected.

The latch circuit 24' also includes circuitry to allow the state of the latch to be read back. The portion of the circuit which allows this includes a first switch 76 and a second switch 78. The DATA input signal is applied as outputs to both the first and second switches 76 and 78. Q and Q_BAR serve as inputs to the switch 76 and 78, respectively. An SelQ_b and an SelQ input signal are applied to the first switch 76 to switch it on or off. Likewise, the SelQb_b and an SelQb input signal are applied to the second switch 78 to switch it on or off. One, and only one, of the switches 76 and 78 will be on at any given time. During this time, the DATA line is in a high impedance state, allowing the value of Q or Q_BAR to be read back.

Figure 4:
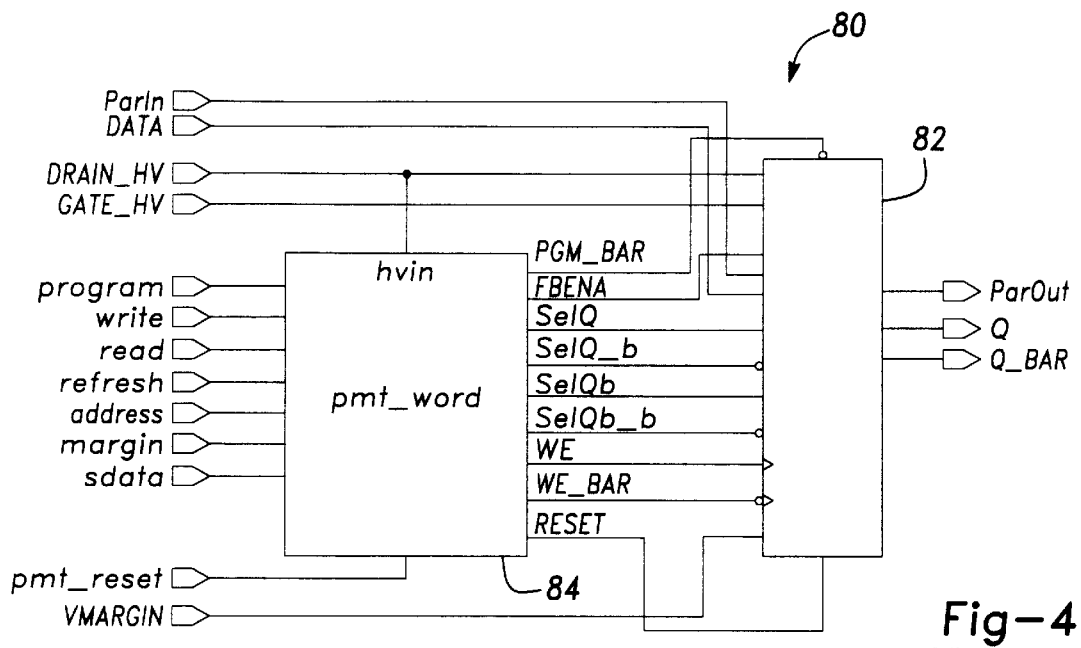
FIG. 4 is a schematic diagram of a PMT latch cell of the invention electrically connected to a command circuit.

FIG. 4 shows a schematic block diagram of a simplified use of the PMT latch circuit of the invention. A typical use of the PMT latch circuit of the invention will include an array of PMT latch cells 82, one of which is shown here, acting as the latch circuit 24'. These multiple cells will be organized in a typical manner for a memory known in the art. Each row of memory cells in the array is controlled by a Pmt_word cell 84, which generates the inputs required by the row of PMT cells in the various modes of operation. Typically, eight PMT cells 82 are driven by each Pmt_word cell 84. There is no reason why more PMT cells could be driven by cell 84. Each PMT cell 82 in the row would have a unique DATA signal, and a ParIN signal of one cell 82 would be fed by the ParOut signal of a previous latch cell. Otherwise, all of the latches in a given word would share the remaining signals generated by the PMT word cell 84. In other words, PGM_BAR, FBENA, SelQ, SelQ_b, SelQb_b, SelQb, WE, WE$_{13}$ BAR and RESET would all be shared among the cells in a given row of the memory.

Figure 5:
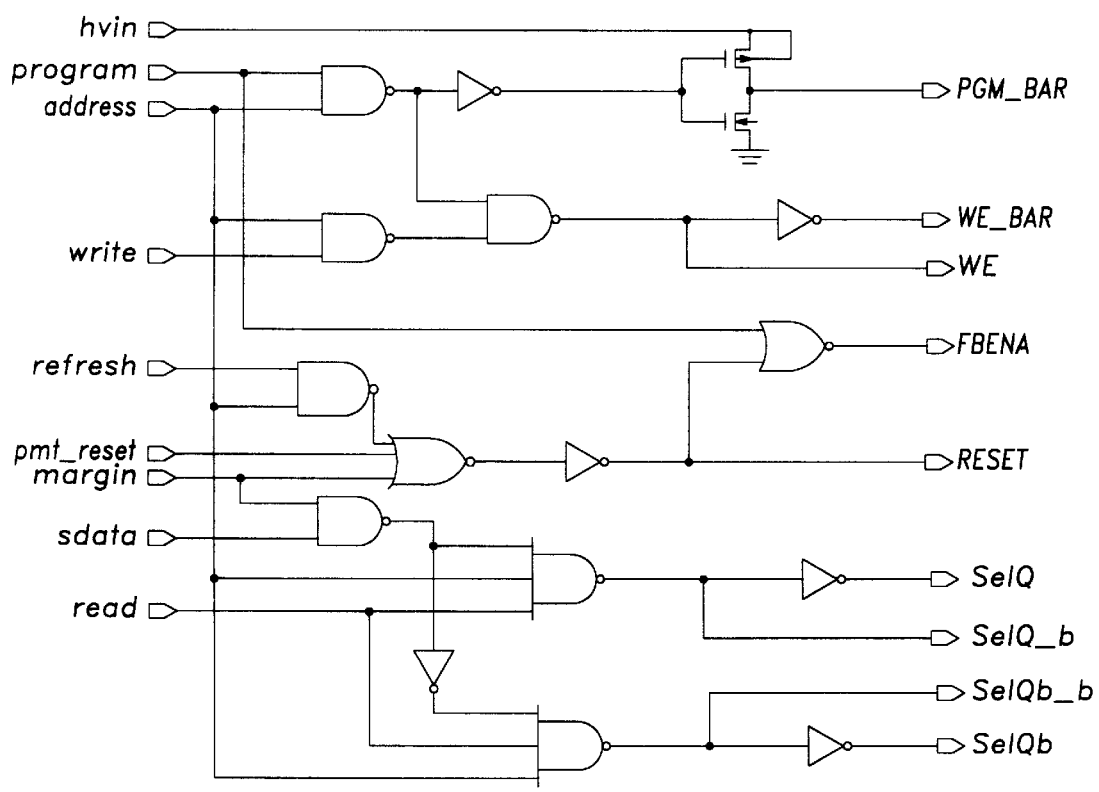
FIG. 5 is a logic circuit diagram of the command circuit shown in FIG. 4.

FIG. 5 is a logic circuit diagram showing the operation of the Pmt_word cell 84 for a temporary right, read and permanent right to the PMT cell 82. The signals that are applied to the Pmt_word cell 84 are generated from a serial peripheral interface (SPI) block. Commands are shifted into the SPI block which are then decoded to generate the program, read, write, refresh, margin, address and data signals. The write, read, program, refresh, margin, pmt_reset and data signals will be common to all rows in the memory array, while the address signal will be unique for each word. The pmt_reset input is taken from the power on reset for the device. The SelQ, SelQ_b, SelQb, and SelQb_b outputs drive circuitry in the PMT cell 82 that allow the Q or Q_BAR outputs of the PMT cell 82 to drive the data signal during a read operation.

Figure 6:
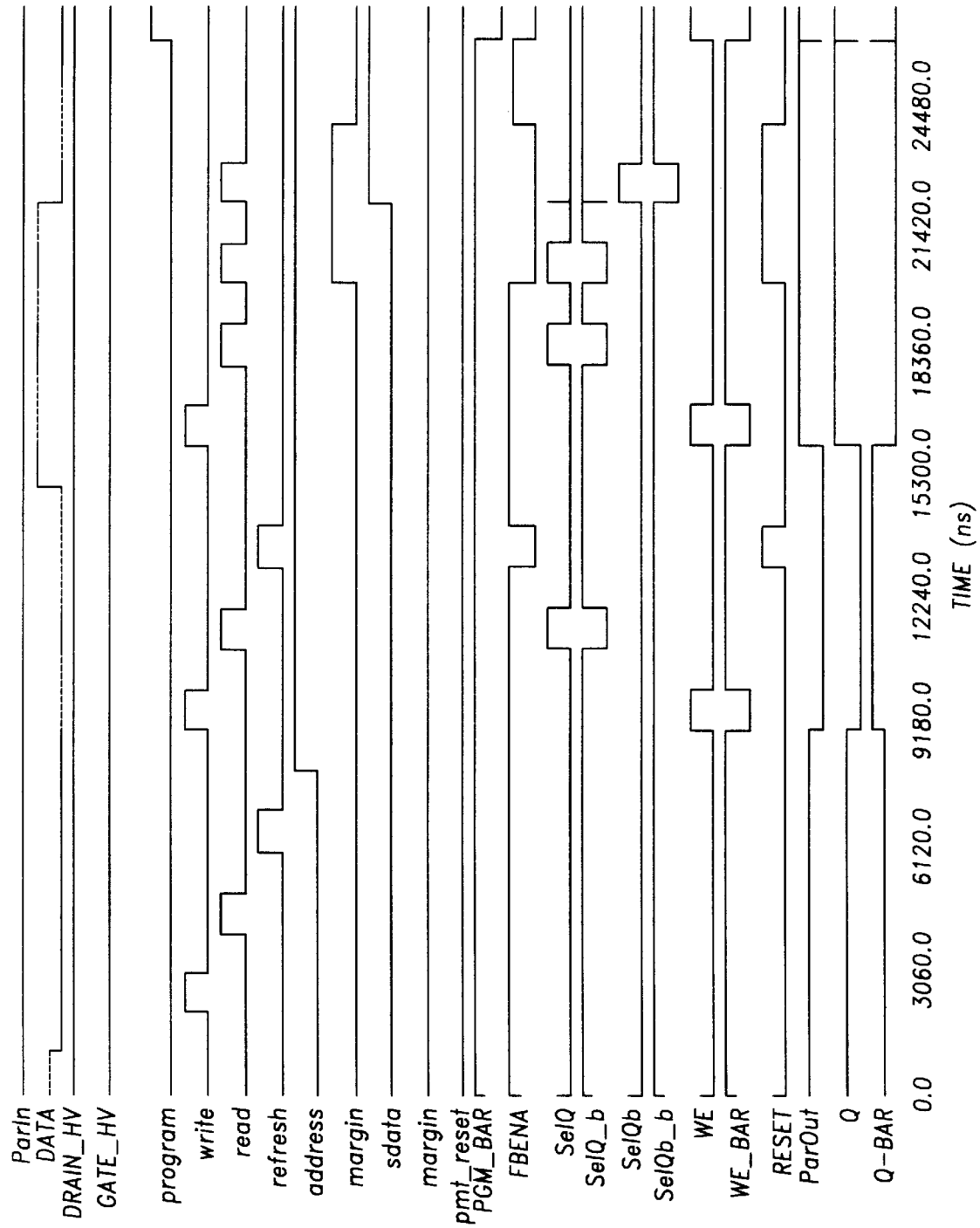
FIG. 6 is a timing diagram for the inputs and outputs of the PMT latch cell of the invention.

FIG. 6 shows certain waveforms of the various inputs to and outputs from the Pmt_word cell 84. There is typically no change in the output wave forms when the address signal is at a low logic level. The exception is a pmt_reset signal which would have a similar effect to a refresh operation, i.e., FBENA is logic low and RESET is logic high. Several operations are shown with the address signal at a logic low level, demonstrating that there is no effect on the outputs. A temporary write operation is shown with the DATA signal low at the 9180 time and then high at the 15300 time. Several read operations are shown with the cell outputs Q and Q_BAR, in different states between the 18360 and 21420 times. Read operations are also shown with the margin signal high, demonstrating the effect of reading from both sides of the latch circuit 24. Also, a permanent write operation is performed at about the 27540 time.

Figure 7:
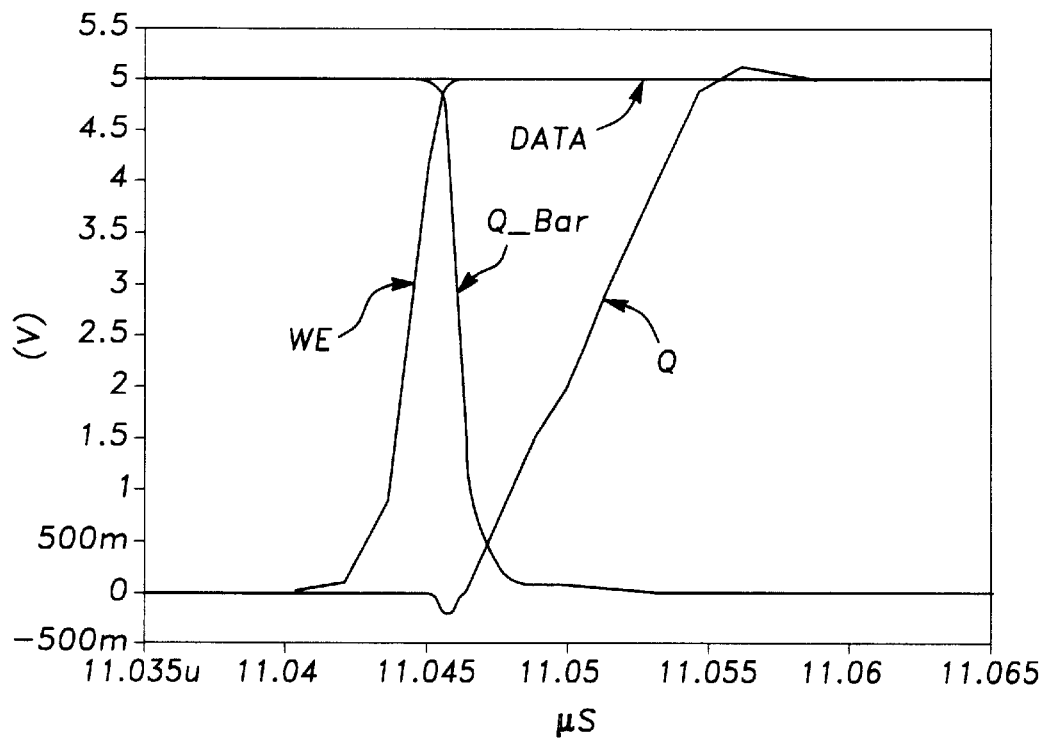
FIG. 7 is a graph of time on the horizontal axis and voltage on the vertical axis showing a program mode of the PMT latch cell of the present invention.
Figure 8:
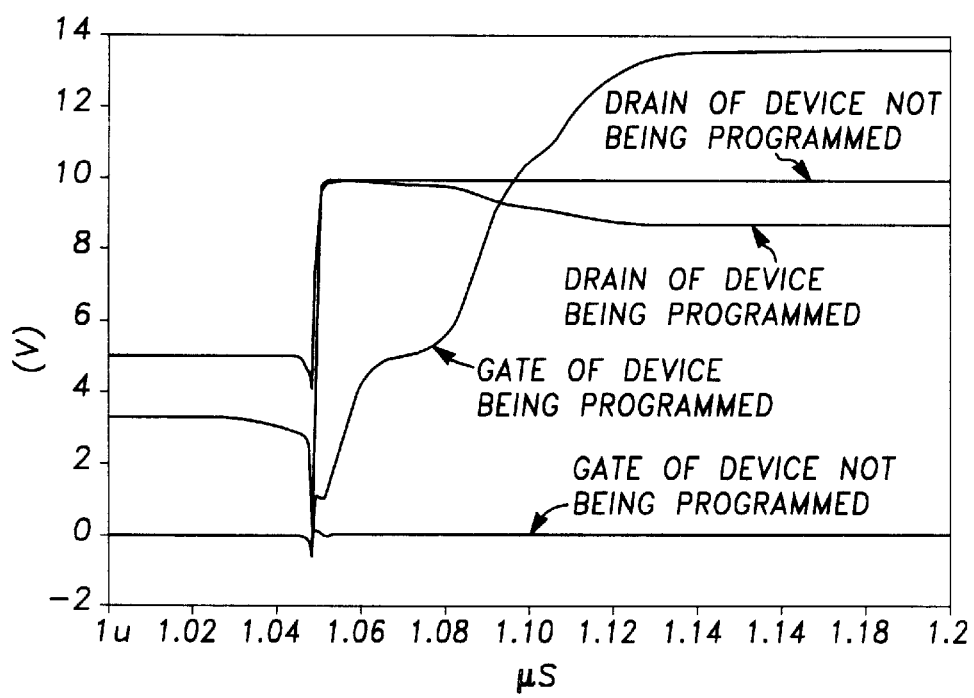
FIG. 8 is a graph of simulation wave forms of the PMT latch cell of the invention in the program mode.

FIG. 7 shows simulation of waveforms for the WE, DATA, Q and Q_BAR signals for a temporary write of the latch circuit 24 of the invention. FIG. 8 shows simulation of waveforms for programming the devices 28 and 30 of the latch 26. These wave-forms do not account for any change in the threshold voltage of the program device.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A programmable latch circuit for storing a value, said circuit comprising:

a first programmable device (28), said first programmable device being a field effect transistor (FET) device including a source terminal, a drain terminal and a gate terminal, said first programmable device further including a first capacitor in series with the gate terminal, one of either the source or drain terminal of the first programmable device being connected to a reference potential;

a second programmable device (30), said second programmable device being an FET device including a source terminal, a drain terminal and a gate terminal, said second programmable device further including a second capacitor in series with the gate terminal, one of either the source or drain terminal of the second programmable device being connected to the reference potential;

a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;

a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source; and a margining input, said margining input being connected to the reference potential and determining a threshold voltage of both the first programmable device and the second programmable device, wherein input signals are applied to the latch circuit to temporarily program one of either the first programmable device or the second programmable device with a logical zero or a logical one, and to subsequently permanently program one of the first programmable device or the second programmable device with a logical zero or a logical one.

2. The latch circuit according to claim 1 further comprising a parity check circuit, said parity check circuit detecting a change in state of the output of the latch circuit.

3. The latch circuit according to claim 1 further comprising a third latch device (40) and a fourth latch device (42), both of the third and fourth latch devices being an FET device including a source terminal, a drain terminal, and a gate terminal, one of either the source or drain terminal of the third latch device being connected to the source or drain terminal of the first programmable device that is not connected to the reference potential and the other of the source or drain terminal of the third latch device being connected to the source or drain terminal of the first latch device that is not connected to the voltage source, and one of either the source or drain terminal of the fourth latch device being connected to the source or drain terminal of the second programmable device and the other of the source or drain terminal of the fourth latch device being connected to the source or drain terminal of the second latch device that is not connected to the voltage source, wherein the third and fourth latch devices are switched on during a latch condition.

4. The latch circuit according to claim 1 further comprising a third latch device (36) and a fourth latch device (38), both of the third and fourth latch devices being an FET device including a source terminal, a drain terminal and a gate terminal, one of either the source or drain terminal of the third latch device being connected to the gate terminals of the first latch device and the first programmable device and the other of the source or drain terminal of the third latch device being connected to the source or drain terminal of the second programmable device that is not connected to the reference potential, and one of either the source or drain terminal of the fourth latch device being connected to the gate terminals of the second latch device and the second programmable device and the other of the source or drain terminal of the fourth latch device being connected to the source or drain terminal of the first programmable device that is not connected to the reference potential, wherein the third and fourth latch devices are switched on under a latch condition.

5. The latch circuit according to claim 1 further comprising a logic gate (52), a third latch device (56), and a fourth latch device (64), each of the third and fourth latch devices being an FET device including a source terminal, a drain terminal, and a gate terminal, an output of the logic gate being connected to the gate terminals of both the third and fourth latch devices, one of either the source or drain terminal of the third latch device being connected to the gate terminals of the first programmable device and the first latch device, and one of either the source or drain terminal of the fourth latch device being connected to the gate terminals of the second programmable device and the second latch device, wherein a high signal on the output of the logic gate switches the third and fourth latch devices on and causes the first programmable device to temporarily store a logic one.

6. The latch circuit according to claim 5 further comprising a fifth latch device (50) and a sixth latch device (60), each of the fifth and sixth latch devices being an FET device including a source terminal, a drain terminal and a gate terminal, one of either the source or drain terminal of the fifth latch device being connected to the source or drain terminal of the first programmable device that is not connected to the reference potential and one of either the source or drain terminal of the sixth latch device being connected to the source or drain terminal of the second programmable device that is not connected to the reference potential, the gate terminals of the fifth and sixth latch devices being connected to a program input, wherein a high signal applied to the gate terminals of the fifth and sixth latch devices from the program input switches the fifth and sixth latch devices on and a high signal at the output of the logic gate causes the first programmable device to be permanently programmed as a logic zero.

7. The latch circuit according to claim 1 further comprising a logic gate (54), a third latch device (62), and a fourth latch device (58), each of the third and fourth latch devices being an FET device including a source terminal, a drain terminal, and a gate terminal, an output of the logic gate being connected to the gate terminals of both the third and fourth latch devices, one of either the source or drain terminal of the third latch device being connected to the gate terminals of the first programmable device and the first latch device, and one of either the source or drain terminal of the forth latch device being connected to the gate terminals of the second programmable device and the second latch device, wherein a high signal at the output of the logic gate switches the third and fourth latch devices on and causes the second programmable device to temporarily store a logic zero.

8. The latch circuit according to claim 7 further comprising a fifth latch device (50) and a sixth latch device (60), each of the fifth and sixth latch devices being an FET device including a source terminal, a drain terminal and a gate terminal, one of either the source or drain terminal of the fifth latch device being connected to the source or drain terminal of the first programmable device that is not connected to the reference potential and one of either the source or drain terminal of the sixth latch device being connected to the source or drain terminal of the second programmable device that is not connected to the reference potential, the gate terminals of the fifth and sixth latch devices being connected to a program input, wherein a high signal applied to the gate terminals of the fifth and sixth latch devices from the program input switches the fifth and sixth latch devices on and a high signal at the output of the logic gate causes the second programmable device to be permanently programmed as a logic one.

9. The latch circuit according to claim 1 further comprising a third latch device (46) and a fourth latch device (48), said third and fourth latch devices being an FET device including a source terminal, a drain terminal and a gate terminal, said gate terminals of each of the third and fourth latch devices being connected to a reset input, one of either the source or drain terminal of the third latch device being connected to the gate terminal of the first programmable device and the other of the source or drain terminal of the third latch device being connected to the reference potential, and one of either the source or drain terminal of the fourth latch device being connected to the gate terminal of the second programmable device and the other of the source or drain terminal of the fourth latch device being connected to the reference potential, wherein a high signal at the reset input switches the third and fourth latch devices on to clear the first and second programmable devices to provide for multiple temporary writes to the first and second programmable devices.

10. A programmable latch circuit for storing a value, said circuit comprising:
    a first programmable device (28), said first programmable device being a field effect transistor (FET) device including a source terminal, a drain terminal and a gate terminal, said first programmable device further including a first capacitor in series with the gate terminal, one of either the source or drain terminal of the first programmable device being connected to a reference potential;
    a second programmable device (30), said second programmable device being an FET device including a source terminal, a drain terminal and a gate terminal, said second programmable device further including a second capacitor in series with the gate terminal, one of either the source or drain terminal of the second programmable device being connected to the reference potential;
    a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;
    a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source;
    a third latch device (56), said third latch device being an FET device including a source terminal, a drain terminal, and a gate terminal, one of either the source or drain terminal of the third latch device being connected to the gate terminals of the first programmable device and the first latch device;
    a fourth latch device (64), said fourth latch device being an FET device including a source terminal, a drain terminal and a gate terminal, one of either the source or drain terminal of the fourth latch device being connected to the gate terminals of the second programmable device and the second latch device;
    a fifth latch device (62), said fifth latch device being an FET device including a source terminal, a drain terminal and a gate terminal, one of either the source or drain terminal of the fifth latch device being connected to the gate terminals of the first programmable device and the first latch device;
    a sixth latch device (58), said sixth latch device being an FET device including a source terminal, a drain terminal and a gate terminal, one of either the source or drain terminal of the sixth latch device being connected to the gate terminals of the second programmable device and the second latch device;
    a first logic gate, an output of the first logic gate being connected to the gate terminals of the third and fourth latch devices; and
    a second logic gate, an output of the second logic gate being connected to the gate terminals of the fifth and sixth latch devices, wherein a high signal on the output of the first logic gate switches the third and fourth latch devices on and causes the first programmable device to temporarily store a logic one, and wherein a high signal on the output of the second logic gate switches the fifth and sixth latch devices on and causes the second programmable device to temporarily store a logic zero.

11. The latch circuit according to claim 10 further comprising a seventh latch device (50) and an eighth latch device (60), both of the seventh and eighth latch devices being an FET device including a source terminal, a drain terminal and a gate terminal, one of either the source or drain terminal of the seventh latch device being connected to the source or drain terminal of the first programmable device that is not connected to the reference potential, one of either the source or drain terminal of the eighth latch device being connected to the source or drain terminal of the second programmable device that is not connected to the reference potential, the gate terminals of the seventh and eighth latch devices being connected to a program input, wherein a high signal applied to the gate terminals of the seventh and eighth latch devices at the program input switches the sixth and seventh latch devices on and a high signal on the output of the first logic gate cause the first programmable device to be permanently programmed as a logic zero and a high signal at the output of the second logic gate causes the second programmable device to be permanently programmed as a logic one.

12. The latch circuit according to claim 11 further comprising a ninth latch device (40) and a tenth latch device (42), both of the ninth and tenth latch devices being an FET device including a source terminal, a drain terminal, and a gate terminal, one of the either source or drain terminal of the ninth latch device being connected to the source or drain terminal of the first programmable device that is not connected to the reference potential and the other of the source or drain terminal of the ninth latch device being connected to the source or drain terminal of the first latch device that is not connected to the voltage source, and one of either the source or drain terminal of the tenth latch device being connected to the source or drain terminal of the second programmable device and the other of the source or drain terminal of the tenth latch device being connected to the source or drain terminal of the second latch device that is not connected to the voltage source, wherein the ninth and tenth latch devices are switched on during a latch condition.

13. The latch circuit according to claim 11 further comprising a ninth latch device (36) and a tenth latch device (38), both of the ninth and tenth latch devices being an FET device including a source terminal, a drain terminal and a gate terminal, one of either the source or drain terminal of the ninth latch device being connected to the gate terminals of the first latch device and the first programmable device and the other of the source or drain terminal of the ninth latch device being connected to the source or drain terminal of the second programmable device that is not connected to the reference potential, and one of either the source or drain terminal of the tenth latch device being connected to the gate terminals of the second latch device and the second programmable device and the other of the source or drain terminal of the tenth latch device being connected to the source or drain terminal of the first programmable device that is not connected to the reference potential, wherein the ninth and tenth latch devices are switched on under a latch condition.

14. The latch circuit according to claim 10 further comprising a seventh latch device (46) and an eighth latch device (48), said seventh and eighth latch devices being an FET device including a source terminal, a drain terminal and a gate terminal, said gate terminals of each of the seventh and eighth latch devices being connected to a reset input, one of either the source or drain terminal of the seventh latch device being connected to the gate terminal of the first programmable device and the other of the source or drain terminal of the seventh latch device being connected to the reference potential, and one of either the source or drain terminal of the eighth latch device being connected to the gate terminal of the second programmable device and the other of the source or drain terminal of the eighth latch device being connected to the reference potential, wherein a high signal at the reset input switches the seventh and eighth latch devices on to clear the first and second programmable devices to provide for multiple temporary writes to the first and second programmable devices.

15. The latch circuit according to claim 10 further comprising a parity check circuit, said parity check circuit detecting a change in the state of both the first programmable device and the second programmable device.

16. The latch circuit according to claim 10 further comprising a margining input, said margining input being connected to the reference potential and determining a threshold voltage of both the first programmable device and the second programmable device.

17. A programmable latch circuit for storing a value, said circuit comprising:

a first programmable device (28), said first programmable device being a field effect transistor (FET) device including a source terminal, a drain terminal and a gate terminal, one of either the source or drain terminal of the first programmable device being connected to a reference potential;

a second programmable device (30), said second programmable device being an FET device including a source terminal, a drain terminal and a gate terminal, one of either the source or drain terminal of the second programmable device being connected to the reference potential;

a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;

a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source;

a third latch device (40), said third latch device being an FET device including a source terminal, a drain terminal and a gate terminal, one of either the source or drain terminal of a third latch device being connected to the source or drain terminal of the first programmable device that is not connected to the reference potential;

a fourth latch device (42), said fourth latch device being an FET device including a source terminal, a drain terminal and a gate terminal, one of either the source or drain terminal of the fourth latch device being connected to the source or drain terminal of the second programmable device and the other of the source or drain terminal of the fourth latch device being connected to the source or drain terminal of the second latch device that is not connected to the voltage source;

a fifth latch device (36), said fifth latch device being an FET device including a source terminal, a drain terminal and a gate terminal, one of either the source or drain terminal of the fifth latch device being connected to the gate terminals of the first latch device and the first programmable device and the other of the source or drain terminal of the fifth latch device being connected to the source or drain terminal of the fifth latch device being connected to the source or drain terminal of the second programmable device and is not connected to the reference potential; and a sixth latch device (38), said sixth latch device being an FET device including a source terminal, a drain terminal and a gate terminal, one of either the source or drain terminal of the sixth latch device being connected to the gate terminals of the second latch device and the second programmable device and the other of the source or drain terminal of the sixth latch device being connected to the source or drain terminal of the first programmable device that is not connected to the reference potential, wherein input signals are applied to the latch circuit to temporarily program one of either the first programmable device or the second programmable device, and to subsequently permanently program one of the first programmable device or the second programmable device and wherein the third, fourth, fifth, and sixth latch devices are switched on under a latch condition.

18. The latch circuit according to claim 17 further comprising a logic gate, a seventh latch device (56), and an eighth latch device (64), each of the seventh and eighth latch devices being an FET device including a source terminal, a drain terminal, and a gate terminal, an output of the logic gate being connected to the gate terminals of both the seventh and eighth latch devices, one of either the source or drain terminal of the seventh latch device being connected to the gate terminals of the first programmable device and the first latch device, and one of either the source or drain terminal of the eighth latch device being connected to the gate terminals of the second programmable device and the second latch device, wherein a high signal on the output of the logic gate switches the seventh and eighth latch devices on and causes the first programmable device to temporarily store a logic one.

19. The latch circuit according to claim 18 further comprising a ninth latch device (50) and a tenth latch device (60), each of the ninth and tenth latch devices being an FET device including a source terminal, a drain terminal and a gate terminal, one of either the source or drain terminal of the ninth latch device being connected to the source or drain terminal of the first programmable device that is not connected to the reference potential and one of either the source or drain terminal of the tenth latch device being connected to the source or drain terminal of the second programmable device that is not connected to the reference potential, the gate terminals of the ninth and tenth latch devices being connected to a program input, wherein a high signal applied to the gate terminals of the ninth and tenth latch devices from the program input switches the ninth and tenth latch devices on and a high signal at the output of the logic gate causes the first programmable device to be permanently programmed as a logic zero.

20. The latch circuit according to claim 17 further comprising a logic gate, a seventh latch device (62), and an eighth latch device (58), each of the seventh and eighth latch devices being an FET device including a source terminal, a drain terminal, and a gate terminal, an output of the logic gate being connected to the gate terminals of both the seventh and eighth latch devices, one of either the source or drain terminal of the seventh latch device being connected to the gate terminals of the first programmable device and the first latch device, and one of either the source or drain terminal of the eighth latch device being connected to the gate terminals of the second programmable device and the second latch device, wherein a high signal at the output of the logic gate switches the seventh and eighth latch devices on and causes the second programmable device to temporarily store a logic zero.

21. The latch circuit according to claim 20 further comprising a ninth latch device (50) and a tenth latch device (60), each of the ninth and tenth latch devices being an FET device including a source terminal, a drain terminal and a gate terminal, one of either the source or drain terminal of the ninth latch device being connected to the source or drain terminal of the first programmable device that is not connected to the reference potential and one of either the source or drain terminal of the tenth latch device being connected to the source or drain terminal of the second programmable device that is not connected to the reference potential, the gate terminals of the ninth and tenth latch devices being connected to a program input, wherein a high signal applied to the gate terminals of the ninth and tenth latch devices from the program input switches the ninth and tenth latch devices on and a high signal at the output of the logic gate causes the second programmable device to be permanently programmed as a logic one.

22. The latch circuit according to claim 17 further comprising a seventh latch device (46) and an eighth latch device (48), said seventh and eighth latch devices being an FET device including a source terminal, a drain terminal and a gate terminal, said gate terminals of each of the seventh and eighth latch devices being connected to a reset input, one of either the source or drain terminal of the seventh latch device being connected to the gate terminal of the first programmable device and the other of the source or drain terminal of the seventh latch device being connected to the reference potential, and one of either the source or drain terminal of the eighth latch device being connected to the gate terminal of the second programmable device and the other of the source or drain terminal of the eighth latch device being connected to the reference potential, wherein a high signal at the reset input switches the seventh and eighth latch devices on to clear the first and second programmable devices to provide for multiple temporary writes to the first and second programmable devices.

23. A programmable latch circuit for storing a value, said circuit comprising:

a first programmable device (28), said first programmable device being a field effect transistor (FET) device including a source terminal, a drain terminal and a gate terminal, said first programmable device further including a first capacitor in series with the gate terminal, one of either the source or drain terminal of the first programmable device being connected to a reference potential;

a second programmable device (30), said second programmable device being an FET device including a source terminal, a drain terminal and a gate terminal, said second programmable device further including a second capacitor in series with the gate terminal, one of either the source or drain terminal of the second programmable device being connected to the reference potential;

a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;

a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source; and a parity check circuit, said parity check circuit detecting a change in state of the output of the latch circuit, wherein input signals are applied to the latch circuit to temporarily program one of either the first programmable device or the second programmable device with a logical zero or a logical one, and to subsequently permanently program one of the first programmable device or the second programmable device with a logical zero or a logical one.

24. A programmable latch circuit for storing a value, said circuit comprising:

a first programmable device (28), said first programmable device being a field effect transistor (FET) device including a source terminal, a drain terminal and a gate terminal, said first programmable device further including a first capacitor in series with the gate terminal, one of either the source or drain terminal of the first programmable device being connected to a reference potential;

a second programmable device (30), said second programmable device being an FET device including a source terminal, a drain terminal and a gate terminal, said second programmable device further including a second capacitor in series with the gate terminal, one of either the source or drain terminal of the second programmable device being connected to the reference potential;

a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;

a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source; and a third latch device (40) and a fourth latch device (42), both of the third and fourth latch devices being an FET device including a source terminal, a drain terminal, and a gate terminal, one of either the source or drain terminal of the third latch device being connected to the source or drain terminal of the first programmable device that is not connected to the reference potential and the other of the source or drain terminal of the third latch device being connected to the source or drain terminal of the first latch device that is not connected to the voltage source, and one of either the source or drain terminal of the fourth latch device being connected to the source or drain terminal of the second programmable device and the other of the source or drain terminal of the fourth latch device being connected to the source or drain terminal of the second latch device that is not connected to the voltage source, wherein the third and fourth latch devices are switched on during a latch condition, and wherein input signals are applied to the latch circuit to temporarily program one of either the first programmable device or the second programmable device with a logical zero or a logical one, and to subsequently permanently program one of the first programmable device or the second programmable device with a logical zero or a logical one.

25. A programmable latch circuit for storing a value, said circuit comprising:

a first programmable device (28), said first programmable device being a field effect transistor (FET) device including a source terminal, a drain terminal and a gate terminal, said first programmable device further including a first capacitor in series with the gate terminal, one of either the source or drain terminal of the first programmable device being connected to a reference potential;

a second programmable device (30), said second programmable device being an FET device including a source terminal, a drain terminal and a gate terminal, said second programmable device further including a second capacitor in series with the gate terminal, one of either the source or drain terminal of the second programmable device being connected to the reference potential;

a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;

a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source; and a third latch device (36) and a fourth latch device (38), both of the third and fourth latch devices being an FET device including a source terminal, a drain terminal and a gate terminal, one of either the source or drain terminal of the third latch device being connected to the gate terminals of the first latch device and the first programmable device and the other of the source or drain terminal of the third latch device being connected to the source or drain terminal of the second programmable device that is not connected to the reference potential, and one of either the source or drain terminal of the fourth latch device being connected to the gate terminals of the second latch device and the second programmable device and the other of the source or drain terminal of the fourth latch device being connected to the source or drain terminal of the first programmable device that is not connected to the reference potential, wherein the third and fourth latch devices are switched on under a latch condition, and wherein input signals are applied to the latch circuit to temporarily program one of either the first programmable device or the second programmable device with a logical zero or a logical one, and to subsequently permanently program one of the first programmable device or the second programmable device with a logical zero or a logical one.

26. A programmable latch circuit for storing a value, said circuit comprising:

a first programmable device (28), said first programmable device being a field effect transistor (FET) device including a source terminal, a drain terminal and a gate terminal, said first programmable device further including a first capacitor in series with the gate terminal, one of either the source or drain terminal of the first programmable device being connected to a reference potential;

a second programmable device (30), said second programmable device being an FET device including a source terminal, a drain terminal and a gate terminal, said second programmable device further including a second capacitor in series with the gate terminal, one of either the source or drain terminal of the second programmable device being connected to the reference potential;

a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;

a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source, wherein input signals are applied to the latch circuit to temporarily program one of either the first programmable device or the second programmable device with a logical zero or a logical one, and to subsequently permanently program one of the first programmable device or the second programmable device with a logical zero or a logical one; and a logic gate (52), a third latch device (56), and a fourth latch device (64), each of the third and fourth latch devices being an FET device including a source terminal, a drain terminal, and a gate terminal, an output of the logic gate being connected to the gate terminals of both the third and fourth latch devices, one of either the source or drain terminal of the third latch device being connected to the gate terminals of the first programmable device and the first latch device, and one of either the source or drain terminal of the fourth latch device being connected to the gate terminals of the second programmable device and the second latch device, wherein a high signal on the output of the logic gate switches the third and fourth latch devices on and causes the first programmable device to temporarily store a logical one.

27. The latch circuit according to claim 26 further comprising a fifth latch device (50) and a sixth latch device (60), each of the fifth and sixth latch devices being an FET device including a source terminal, a drain terminal and a gate terminal, one of either the source or drain terminal of the fifth latch device being connected to the source or drain terminal of the first programmable device that is not connected to the reference potential and one of either the source or drain terminal of the sixth latch device being connected to the source or drain terminal of the second programmable device that is not connected to the reference potential, the gate terminals of the fifth and sixth latch devices being connected to a program input, wherein a high signal applied to the gate terminals of the fifth and sixth latch devices from the program input switches the fifth and sixth latch devices on and a high signal at the output of the logic gate causes the first programmable device to be permanently programmed as a logic zero.

28. A programmable latch circuit for storing a value, said circuit comprising:

a first programmable device (28), said first programmable device being a field effect transistor (FET) device including a source terminal, a drain terminal and a gate terminal, said first programmable device further including a first capacitor in series with the gate terminal, one of either the source or drain terminal of the first programmable device being connected to a reference potential;

a second programmable device (30), said second programmable device being an FET device including a source terminal, a drain terminal and a gate terminal, said second programmable device further including a second capacitor in series with the gate terminal, one of either the source or drain terminal of the second programmable device being connected to the reference potential;

a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;

a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source, wherein input signals are applied to the latch circuit to temporarily program one of either the first programmable device or the second programmable device with a logical zero or a logical one, and to subsequently permanently program one of the first programmable device or the second programmable device with a logical zero or a logical one; and a logic gate (54), a third latch device (62), and a fourth latch device (58), each of the third and fourth latch devices being an FET device including a source terminal, a drain terminal, and a gate terminal, an output of the logic gate being connected to the gate terminals of both the third and fourth latch devices, one of either the source or drain terminal of the third latch device being connected to the gate terminals of the first programmable device and the first latch device, and one of either the source or drain terminal of the forth latch device being connected to the gate terminals of the second programmable device and the second latch device, wherein a high signal at the output of the logic gate switches the third and fourth latch devices on and causes the second programmable device to temporarily store a logical zero.

29. The latch circuit according to claim 28 further comprising a fifth latch device (50) and a sixth latch device (60), each of the fifth and sixth latch devices being an FET device including a source terminal, a drain terminal and a gate terminal, one of either the source or drain terminal of the fifth latch device being connected to the source or drain terminal of the first programmable device that is not connected to the reference potential and one of either the source or drain terminal of the sixth latch device being connected to the source or drain terminal of the second programmable device that is not connected to the reference potential, the gate terminals of the fifth and sixth latch devices being connected to a program input, wherein a high signal applied to the gate terminals of the fifth and sixth latch devices from the program input switches the fifth and sixth latch devices on and a high signal at the output of the logic gate causes the second programmable device to be permanently programmed as a logic one.

30. A programmable latch circuit for storing a value, said circuit comprising:

a first programmable device (28), said first programmable device being a field effect transistor (FET) device including a source terminal, a drain terminal and a gate terminal, said first programmable device further including a first capacitor in series with the gate terminal, one of either the source or drain terminal of the first programmable device being connected to a reference potential;

a second programmable device (30), said second programmable device being an FET device including a source terminal, a drain terminal and a gate terminal, said second programmable device further including a second capacitor in series with the gate terminal, one of either the source or drain terminal of the second programmable device being connected to the reference potential;

a first latch device (32), said first latch device being an FET device including a source terminal, a drain terminal and a gate terminal, one of either the source or drain terminal of the first latch device being connected to the source or drain terminal of the first programmable device that is not connected to the reference potential and the other of the source or drain terminal of the first latch device being connected to a voltage source;

a second latch device (34), said second latch device being an FET device including a source terminal, a drain terminal, and a gate terminal, one of either the source terminal or the drain terminal of the second latch device being connected to the source or drain terminal of the second programmable device that is not connected to the reference potential and the other of the source or drain terminal of the second latch device being connected to the voltage source wherein input signals are applied to the latch circuit to temporarily program one of either the first programmable device or the second programmable device with a logical zero or a logical one, and to subsequently permanently program one of the first programmable device or the second programmable device with a logical zero or a logical one; and a third latch device (46) and a fourth latch device (48), said third and fourth latch devices being an FET device including a source terminal, a drain terminal and a gate terminal, said gate terminals of each of the third and fourth latch devices being connected to a reset input, one of either the source or drain terminal of the third latch device being connected to the gate terminal of the first programmable device and the other of the source or drain terminal of the third latch device being connected to the reference potential, and one of either the source or drain terminal of the fourth latch device being connected to the gate terminal of the second programmable device and the other of the source or drain terminal of the fourth latch device being connected to the reference potential, wherein a high signal at the reset input switches the third and fourth latch devices on to clear the first and second programmable devices to provide for multiple temporary writes to the first and second programmable devices.

* * * * *